United States Patent

Okamura et al.

[11] Patent Number: 5,287,312
[45] Date of Patent: Feb. 15, 1994

[54] DYNAMIC RANDOM ACCESS MEMORY

[75] Inventors: Junichi Okamura, Yokohama; Tohru Furuyama, Tokyo, both of Japan

[73] Assignee: Kabushiki Kaisha Toshiba, Kawasaki, Japan

[21] Appl. No.: 813,492

[22] Filed: Dec. 26, 1991

[30] Foreign Application Priority Data

Dec. 26, 1990 [JP] Japan ................ 2-418371

[51] Int. Cl.⁵ ................................ G11C 7/00
[52] U.S. Cl. .................. 365/201; 365/230.06
[58] Field of Search .......... 365/201, 189.09, 230.06, 365/230.08

[56] References Cited

U.S. PATENT DOCUMENTS

| | | | |
|---|---|---|---|
| 4,651,304 | 3/1987 | Takata | 365/201 |
| 4,654,849 | 3/1987 | White | 365/201 |
| 4,751,679 | 6/1988 | Dehganpour | 365/201 |
| 4,873,669 | 10/1989 | Furutani | 365/201 |
| 4,969,124 | 11/1990 | Luich | 365/201 |
| 4,999,813 | 3/1991 | Ohtsuka | 365/201 |
| 5,157,629 | 10/1992 | Sato | 365/201 |

Primary Examiner—Eugene R. LaRoche
Assistant Examiner—A. Zarabian
Attorney, Agent, or Firm—Banner, Birch, McKie & Beckett

[57] ABSTRACT

A dynamic random access memory according to the present invention comprises a plurality of dynamic memory cells arranged in rows and columns, a word line connected to the memory cells on the same row, a bit line connected to the memory cells on the same column, a word line selecting circuit having a word line selecting function of selecting an arbitrary one of the rows in response to an internal address signal, a word line driving voltage source, a word line driving circuit having at least one driving MOS transistor connected between the word line driving voltage source and the word line, for driving the word line in response to an output signal of the word line selecting circuit, and a control circuit for, in response to a voltage stress test control signal input from outside, controlling the word line driving circuit so that the word line driving circuit drives word lines more than those selected in a normal operation mode upon receiving an external address signal.

8 Claims, 9 Drawing Sheets

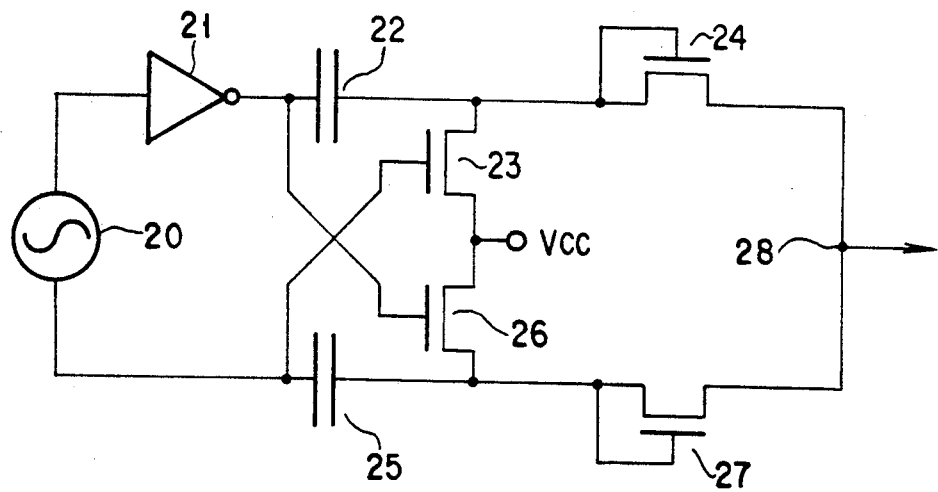
F I G. 2

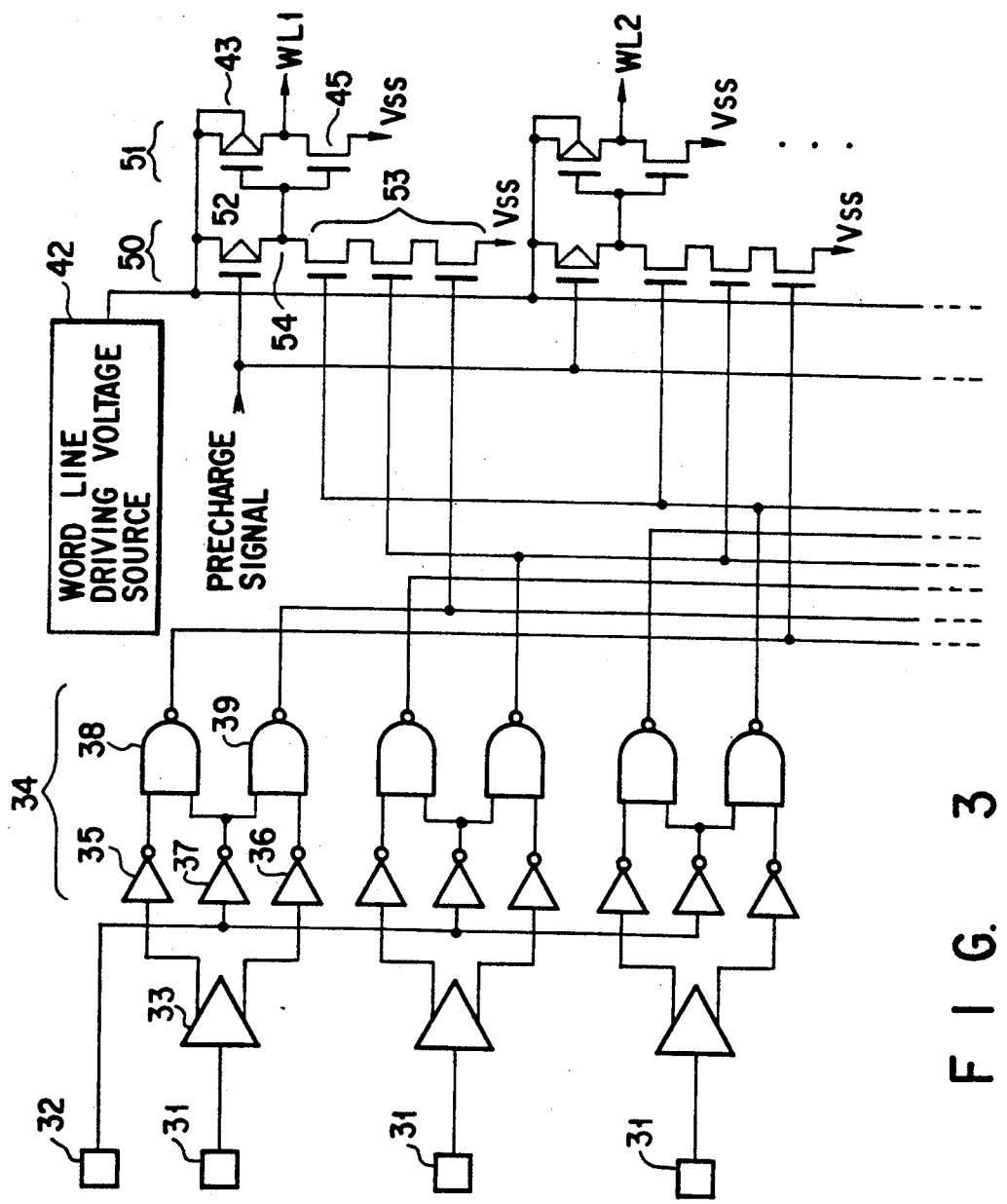
F I G. 3

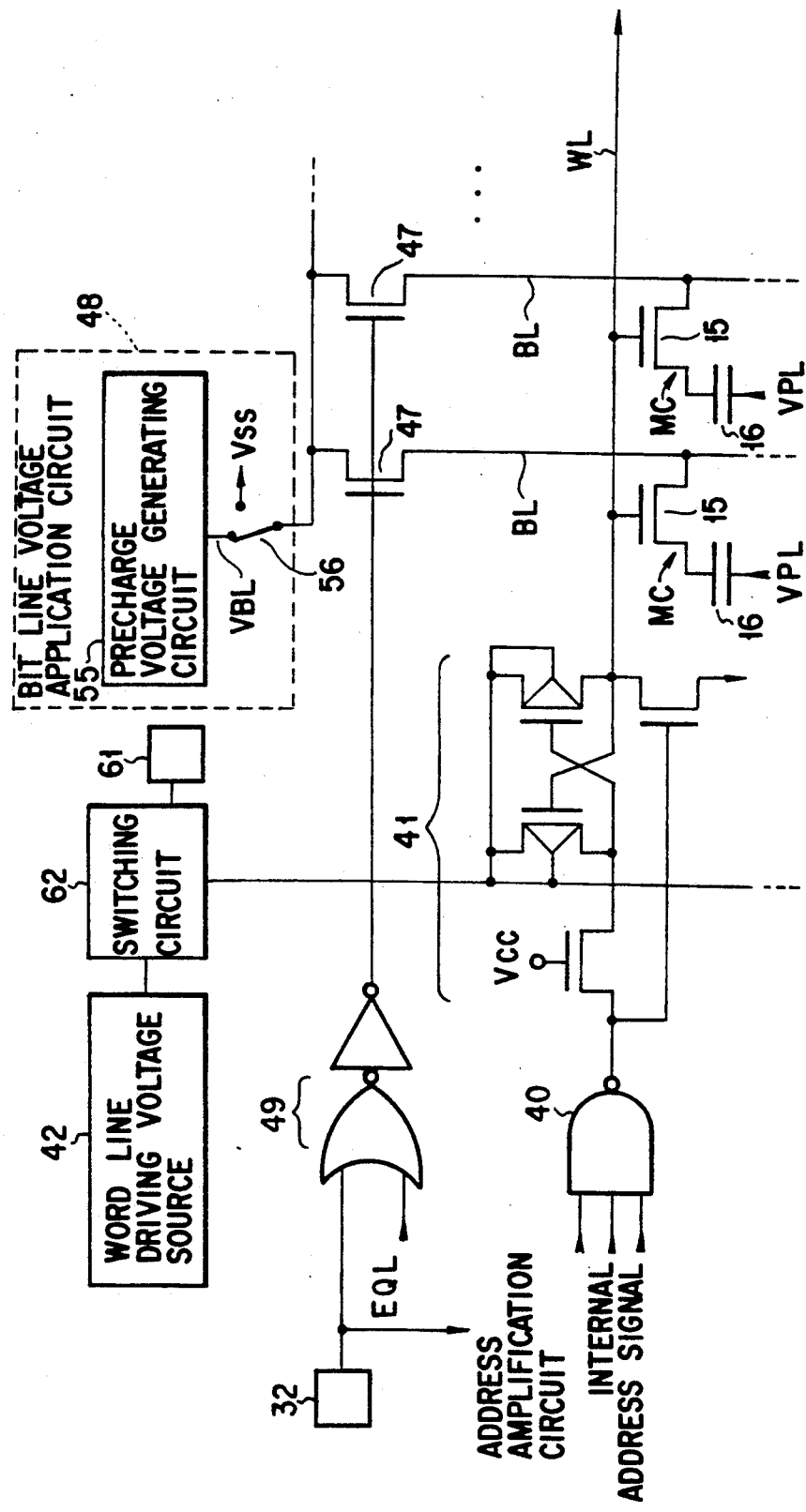
F I G. 4

DYNAMIC RANDOM ACCESS MEMORY

BACKGROUND OF THE INVENTION

1. Field of the Invention

The present invention relates to a dynamic random access memory (DRAM) and, more particularly, to stress applying means for applying voltage stress to word line groups more acceleratedly than a normal use at the time of screening defectiveness in a wafer state.

2. Description of the Related Art

A screening is generally performed to expose latent defects in semiconductor devices and remove from finished batches those devices having defects. This screening process prevents defect-free devices from being adversely affected by defective devices and ensures the reliability of the finished semiconductor devices when they are put on the market. As one screening method, a burn-in capable of accelerating an electric field and a temperature at the same time is frequently employed. In this burn-in, semiconductor devices are operated using a voltage higher than the actual working voltage and a temperature higher than the actual working temperature, and voltage stress is applied to the semiconductor devices for a short period of time longer than the initial failure period under actual working conditions. The semiconductor devices are then screened and those which are considered likely to malfunction in initial operation are removed. This type of screening is an efficient method of removing defective devices, thereby enhancing the reliability of finished semiconductor devices.

In recent DRAMs, a potential (for example, approximately 1.5×Vcc) boosted when a transfer gate (hereinafter referred to as cell transistor) of memory cell is selected is applied to a gate oxide film of the memory cell transistor. Even though the gate oxide film is thick, a strong electric field is applied thereto and thus the reliability of the DRAMs may be lowered. It is thus necessary to actively screen cell transistors having gates to which a boosted potential is applied when the burn-in of DRAMs is performed.

To screen the memory cells when the burn-in of DRAMs is performed, a method of scanning an address so as to sequentially access word lines connected to the gates of the cell transistors was conventionally used. In this method, voltage stress is applied to the cell transistors less frequently than to transistors of a peripheral circuit and a time period for which the greatest electric field is actually applied to the cell transistors is short; accordingly, a long time is needed for the burn-in of DRAMs.

In order to eliminate the above drawback wherein the voltage stress is applied to the cell transistors less frequently, one of the inventors of the present invention proposed a semiconductor memory capable of improving in efficiency with which voltage stress is applied to cell transistors, as disclosed in Published Unexamined Japanese Patent Application (kokai) No. 3-35491 which corresponds to U.S. patent application Ser. No. 07/544,614. The semiconductor memory is so formed that voltage stress can be applied to all word lines or word lines more than those selected in a normal operation mode when a defective cell transistor is screened.

If the above proposal is applied to a DRAM, defective cell transistors can considerably be reduced and 1M or 4M DRAMs having bit defects can be decreased at high speed by the screening. Therefore, the screening can be greatly improved in efficiency.

It is desirable to materialize a means for applying voltage stress to all word lines or word lines more than those selected in the normal operation mode when a operation power is supplied to the DRAMs.

SUMMARY OF THE INVENTION

The present invention has been made in consideration of the above situation and its object is to provide a dynamic random access memory (DRAM) capable of greatly improving the efficiency of a screening which is performed when operation power is supplied to the DRAM.

To attain the above object, a dynamic random access memory according to the present invention comprises: a plurality of dynamic memory cells arranged in rows and columns; a word line connected to the memory cells on the same row; a bit line connected to the memory cells on the same column; a word line selecting circuit having a word line selecting function of selecting an arbitrary one of the rows in response to an internal address signal; a word line driving voltage source; a word line driving circuit having at least one driving MOS transistor connected between the word line driving voltage source and word line, for driving the word line in response to an output signal of the word line selecting circuit; and a control circuit for, in response to a voltage stress test control signal input from outside, controlling the word line driving circuit so that the word line driving circuit drives word lines more than those selected in a normal operation mode upon receiving an external address signal.

According to an aspect of the present invention, when operation power is supplied to the dynamic random access memory to perform a screening, voltage stress can be applied to all word lines or word lines more than selected in the normal operation mode through the word line driving circuit in response to the voltage stress test control signal. It is thus possible to screen cell transistors with high efficiency.

If the cell transistors are N-channel type MOS transistors, a P channel type MOS transistor is used as a word line driving transistor connected between the word line driving voltage source and word line, and the gate of the P-channel type MOS transistor is fixed to the ground potential to stabilize the gate node. It is thus possible to stably apply the voltage stress to the word line through the P-channel type MOS transistor.

The control circuit has a relatively simple arrangement, and the DRAM chip need not increase in the area for the control circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing an example of a word line driving voltage source in the DRAM shown in FIG. 1;

FIG. 3 is a circuit diagram showing a modification to the DRAM shown in FIG. 1;

FIG. 4 is a circuit diagram showing part of a DRAM according to a second embodiment of the present invention;

DETAILED DESCRIPTION OF THE PREFERRED EMBODIMENTS

Figure 1:
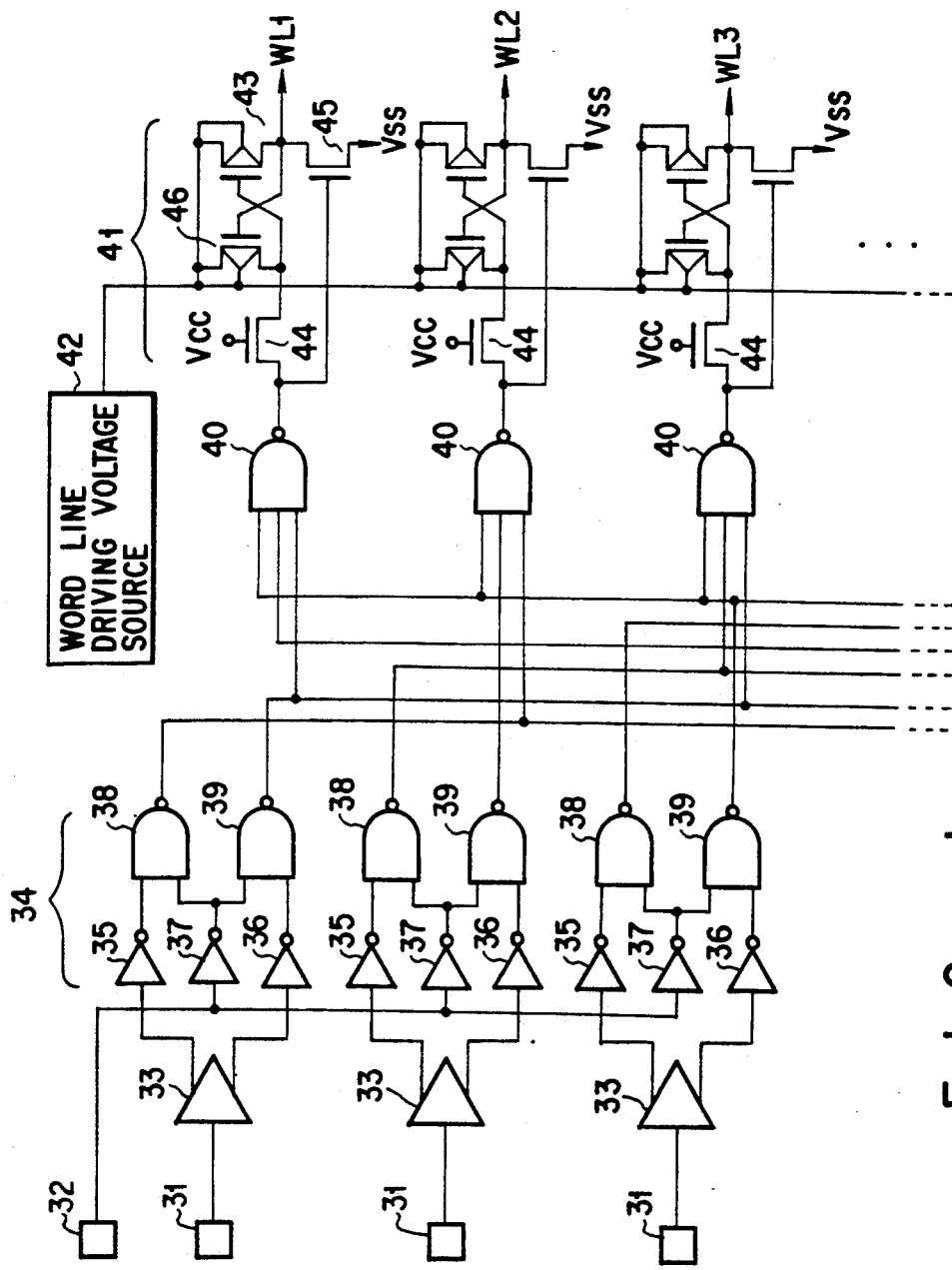
FIG. 1 is a circuit diagram showing part of a DRAM according to a first embodiment of the present invention

Embodiments of the present invention will be described in detail when taken in conjunction with the accompanying drawings. The descriptions of the elements denoted by the same numerals in the drawings are omitted.

FIG. 1 is a circuit diagram showing part of a DRAM according to a first embodiment of the present invention. In FIG. 1, reference numeral 31 indicates bonding pads for receiving address signals from outside a semiconductor chip; 32 denotes a pad, which is not used in a normal operation mode, for receiving a voltage stress test control signal from outside when a voltage stress test is carried out; 33 shows address amplifying circuits for receiving the address signals and generating internal address signals which are complementary to each other; and 34 represents a control circuit having gate circuit groups connected to the outputs of the address amplifying circuits 33, for outputting the internal address signals from the address amplifying circuits 33 in the normal operation mode and controlling the internal address signals so as to select lines more than those selected in the normal operation mode in accordance with the external address signals when the voltage stress test is carried out.

The control circuit 34 includes inverter groups 35 and 36 for receiving the internal address signals from the address amplifying circuits 33, inverter groups 37 for receiving a signal from the pad 32, and two-input NAND gate groups 38 and 39 for receiving outputs of the inverter groups 37 and those of the inverter groups 35 and 36.

In FIG. 1, reference numeral 40 indicates word line selecting circuits including NAND gate groups for outputting word line selecting signals in accordance with the internal address signals supplied from the control circuit 34, and reference numeral 41 denotes a word line driving circuit, including at least one driving MOS transistor 43 connected between a word line driving voltage source 42, described later, and a word line WLi (i=1, 2, 3, . . . ) the word line WLi in response to the signals output from the word line selecting circuits 40.

The word line driving circuit 41 includes an NMOS transistor 44 whose one end is connected to an output terminal of each of the word line selecting circuits 40 and whose gate is supplied with power supply potential Vcc, a word line driving PMOS transistor 43 whose gate is connected to the other end of the NMOS transistor 44, whose source and substrate are connected to each other, and which is connected between the word line driving voltage source 42 and the word line WLi, a pull-down NMOS transistor 45 connected between the word line WLi and ground potential Vss, and a pull-up PMOS transistor 46 whose gate is connected to the word line WLi, whose source and substrate are connected to each other, and which is connected between the word line driving voltage source 42 and the gate of the PMOS transistor 43.

In the first embodiment, the word line driving voltage source 42 is formed on a DRAM chip and includes a booster circuit for boosting the power supply voltage Vcc externally supplied and applying the boosted voltage to the word line driving circuit 41.

FIG. 2 is a circuit diagram showing an example of the booster circuit of the word line driving voltage source 42. The booster circuit comprises a clock signal generating circuit 20, an inverter circuit 21, a first bootstrap capacitor 22 whose one end is supplied with a first clock signal, a first MOS transistor 23 which is connected between a Vcc node and the first bootstrap capacitor 22 and whose gate is supplied with a second clock signal, a MOS transistor 24 whose drain and gate are connected to a connection node of the first MOS transistor 23 and the first bootstrap capacitor 22 and whose source is connected to a boosted voltage output node 28, a second bootstrap capacitor 25 whose one end is supplied with the second clock signal, a second MOS transistor 26 which is connected between the Vcc node and the second bootstrap capacitor 25 and whose gate is supplied with the first clock signal, and a MOS transistor 27 whose drain and gate are connected to a connection node of the second MOS transistor 26 and the second bootstrap capacitor 25 and whose source is connected to the boosted voltage output node 28.

The DRAM as shown in FIG. 1 usually includes a plurality of dynamic memory cells MC (one of which is shown in FIG. 4) arranged in rows and columns. A single word line WL is connected to the memory cells MC on the same row, and a single bit line BL is connected to the memory cells MC on the same column. In these memory cells MC, the gate of an NMOS transistor 15 is connected to the word line WL, the drain thereof is connected to the bit line BL, and the source thereof is connected to one end of a capacitive element 16 for storing information. The other end of the capacitive element 16 is connected to a capacitor plate potential VPL.

An operation of the DRAM shown in FIG. 1 will be described.

In the normal operation of the DRAM, when an address signal is supplied to the address amplifying circuits 33 from outside, internal address signals, which are complementary to each other, are generated, and word line selecting signals for an arbitrary number of word lines are output in accordance with a combination of logic levels of the internal address signals, thereby selecting word lines WLi.

In the word line driving circuit 41 to which a word line selecting signal having an activation level of "L" is input, the NMOS transistor 45 is turned off and the NMOS transistor 44 is turned on. The PMOS transistor 43, whose gate is fixed to the ground potential Vss, is turned on to set the word line WLi to a high level. The PMOS transistor 46 is turned off since its gate (word line) is high in level. In the word line driving circuit 41 to which a word line selecting signal having an inactivation level of "H" is input, the NMOS transistor 45 is turned on and the NMOS transistor 44 is turned off. The PMOS transistor 46 is turned on since its gate (word line) is low in level, and the PMOS transistor 43 is turned off since its gate is high in level.

When the burn-in of a wafer is performed, operation power is supplied to the DRAM to allow it to operate, and a voltage stress test control signal of high level is input to the pad 32. The control circuit 34 sets all the internal address signals, which are complementary to each other, high in level and sets all the output signals of the word line selecting circuits 40 low in level. All the word lines WLi are therefore driven.

According to the DRAM shown in FIG. 1, the control circuit 34 controls the internal address signals so as to select rows more than those selected in response to the external address signals in the normal operation mode based on the voltage stress test control signal externally supplied through the pad 32 which is not used in the normal operation mode. The word line driving circuit 41 thus drives rows more than those selected in response to the external address signals supplied in the normal operation mode.

As a result, a direct-current voltage stress can be applied at once to all the word lines WLi or word lines WLi more than those selected in the normal operation mode through the word line driving circuit 41 in the burn-in, and the efficiency of the burn-in can remarkably be improved.

Since the cell transistors 15 are N-channel type (first conductive type) MOS transistor, P-channel type (second conductive type opposite to the first conductive type) MOS transistor 43 is used as a word line driving transistor, and the gate and node of the PMOS transistor 43 are fixed to the ground voltage Vss to stabilize the gate node when the voltage stress test is carried out. A drop in the potential of the word line due to a current leak of the gate node of the PMOS transistor 43 can be prevented, and a direct-current voltage stress can stably be applied to the word lines WLi through the PMOS transistor 43. Since the control circuit 34 has a relatively simple arrangement, the area of the control circuit 34 is small on the DRAM chip.

FIG. 3 is a circuit diagram showing a modification to the DRAM shown in FIG. 1.

The DRAM of FIG. 3 differs from that of FIG. 1 in the use of a word line selecting circuit 50 of a precharge NAND gate and a word line driving circuit 51 of a CMOS inverter.

In the word line selecting circuit (precharge NAND gate) 50, a precharging PMOS transistor 52 and an NMOS transistor group 53 for decoding an internal address signal are connected in series between the word line driving voltage source 42 and ground potential Vss. A connection point of the PMOS transistor 52 and NMOS transistor group 53 is an output node 54.

In the word line selecting circuit 50, a precharge signal is rendered low in active level and the output node 54 is precharged to a high level. When all of internal address signals supplied from the control circuit 34 are rendered high in level, a signal (word line selecting signal) from the output node 54 becomes low in level.

The word line driving circuit (CMOS inverter) 51 includes a PMOS transistor 43 and an NMOS transistor 45. The transistor 43 is turned on when the level of the word line selecting signal becomes low, and the transistor 45 is turned on when the level of the word line selecting signal becomes high.

The DRAM of FIG. 3 is basically able to perform the same operation as that of FIG. 1 and the same advantage can be obtained from the DRAMS shown in FIGS. 1 and 3.

FIG. 4 is a circuit diagram showing part of a DRAM according to a second embodiment of the present invention. The DRAM of FIG. 4 differs from that of FIG. 1 in the use of a bit line potential control means for connecting each of the bit lines to a desired fixed potential in the voltage stress test, a pad 61 for applying a word line driving voltage, and a switching circuit 62. The operations of the pad 6 and switching circuit 62 will be described later with reference to FIG. 5.

For example, the bit line potential control means is so constructed that a switching NMOS transistor 47 is connected to one end of each bit line BL and a bit line voltage application circuit 48 for applying a desired voltage is connected to one end of the NMOS transistor 47 to turn on the NMOS transistor 47 when a signal is supplied from the pad 32.

The bit line voltage application circuit 48 includes a precharge voltage generating circuit 55 for applying bit line precharge potential VBL (potential between power supply potential Vcc and ground potential Vss, usually represented by Vcc/2) to the bit lines BL in the normal operation mode. The circuit 48 also includes a switching circuit 56 which is so controlled as to switch an output of the precharge voltage generating circuit 55 to a desired voltage (e.g., ground potential Vss) in response to the voltage stress test control signal and a control circuit (not shown) for controlling the switching circuit 56.

The DRAM of FIG. 4 includes a logic circuit 49 in order to use the switching transistor 47 as a bit line precharging transistor used in the normal operation mode. The logic circuit 49 is so constructed that a logical OR is carried out between a signal input from the pad 32 and a bit line precharging/equalizing signal EQL and the logical OR is applied to the gate of the switching transistor 47.

The DRAM of FIG. 4 is basically able to perform the same operation as that of FIG. 1 and the same advantage can be obtained from the DRAMs of FIGS. 1 and 4. Since each of bit lines BL can be set to the ground potential Vss by means of the switching transistor 47, a great voltage stress can be applied between the gate and drain of the cell transistor 15 in the voltage stress test.

Figure 5:
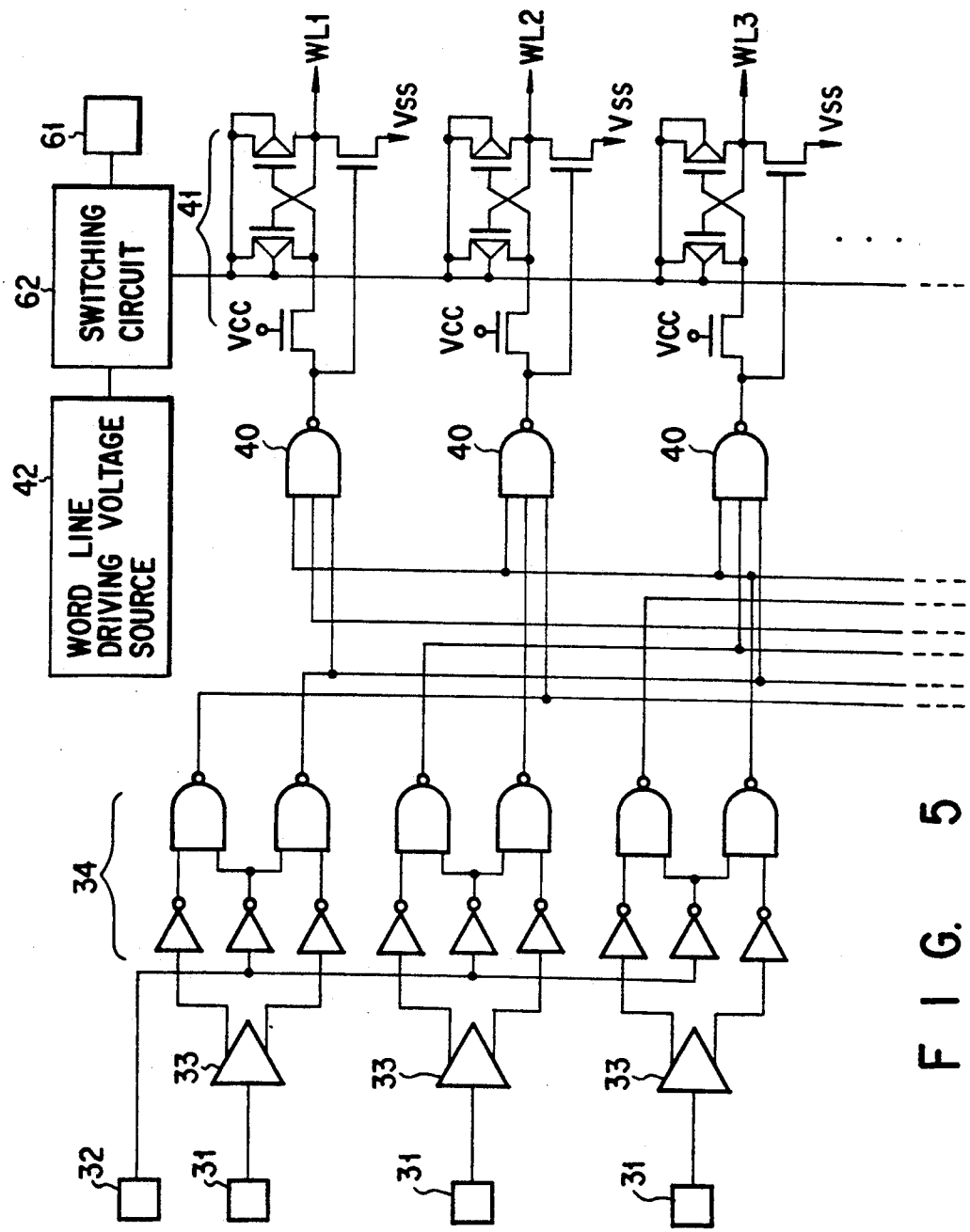
FIG. 5 is a circuit diagram showing part of a DRAM according to a third embodiment of the present invention.

FIG. 5 is a circuit diagram showing part of a DRAM according to a third embodiment of the present invention. The DRAM of FIG. 5 differs from that of FIG. 1 in the use of a pad 61 for applying a word line driving voltage which is not used in the normal operation mode and a switching circuit 62.

Figure 6:
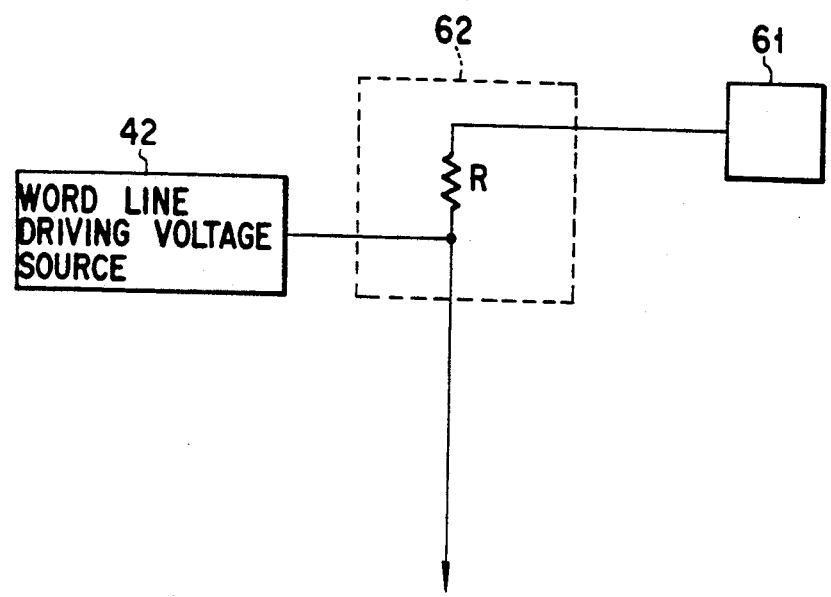
FIG. 6 is a circuit diagram showing an example of a switching circuit in the DRAM shown in FIG. 5.

FIG. 6 is a circuit diagram showing an example of the switching circuit 62 of the DRAM shown in FIG. 5. The switching circuit 62 includes a resistor R connected between the pad 61 and the output node of word line driving voltage source 42.

In the normal operation mode, the switching circuit selects a output voltage of the word line driving voltage source 42 and supplies it as a word line driving voltage. In the voltage stress test, if an output impedance of an external voltage source (not shown) connected to the pad 61 is considerably lower than that of the word line driving voltage source 42, the switching circuit 62 selects a desired stress voltage applied from the external voltage source through the pad 61 and supplies it as a word line driving voltage. In addition, a boost operation of the word line driving voltage source 42 can be stopped when the voltage stress test is carried out.

The DRAM of FIG. 5 is basically able to perform the same operation as that of FIG. 1 and the same advantage can be obtained from the DRAM shown in FIG. 1. The DRAM of FIG. 5 has the advantage of transitionally preventing a voltage drop from occurring when all the word lines WLi are driven even though the word line driving voltage source 42 has only the capability of driving the word lines selected in the normal operation mode. It is thus possible to directly apply stress to the word lines WLi through the word line driving circuit 41.

Even though the switching circuit 62 is eliminated from the DRAM of FIG. 5, the pad 61 is connected to the output node of the word line driving voltage source 42, and the word line driving voltage is supplied from the external voltage source through the pad 61 during the voltage stress test, the same advantage can be obtained.

Figure 7:
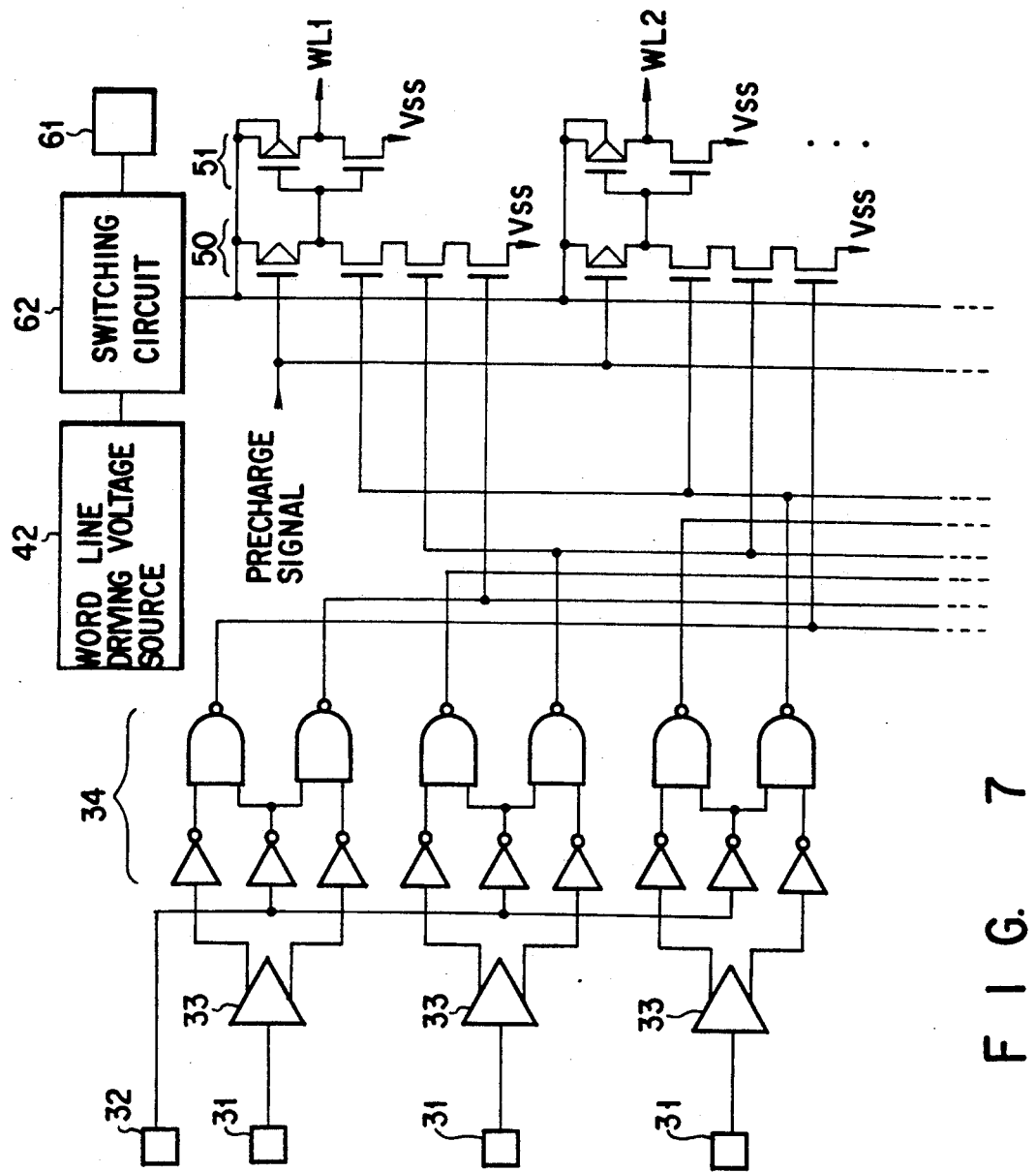
FIG. 7 is a circuit diagram showing a modification to the DRAM shown in FIG. 5.

FIG. 7 is a circuit diagram showing a modification of the DRAM shown in FIG. 5. The DRAM of FIG. 7 differs from that of FIG. 5 in the use of the word line selecting circuit 50 and word line driving circuit 51. The DRAM of FIG. 7 is basically able to perform the same operation as that of FIG. 5 and the same advantage can be obtained from the DRAMs shown in FIGS. 5 and 7.

Figure 8:
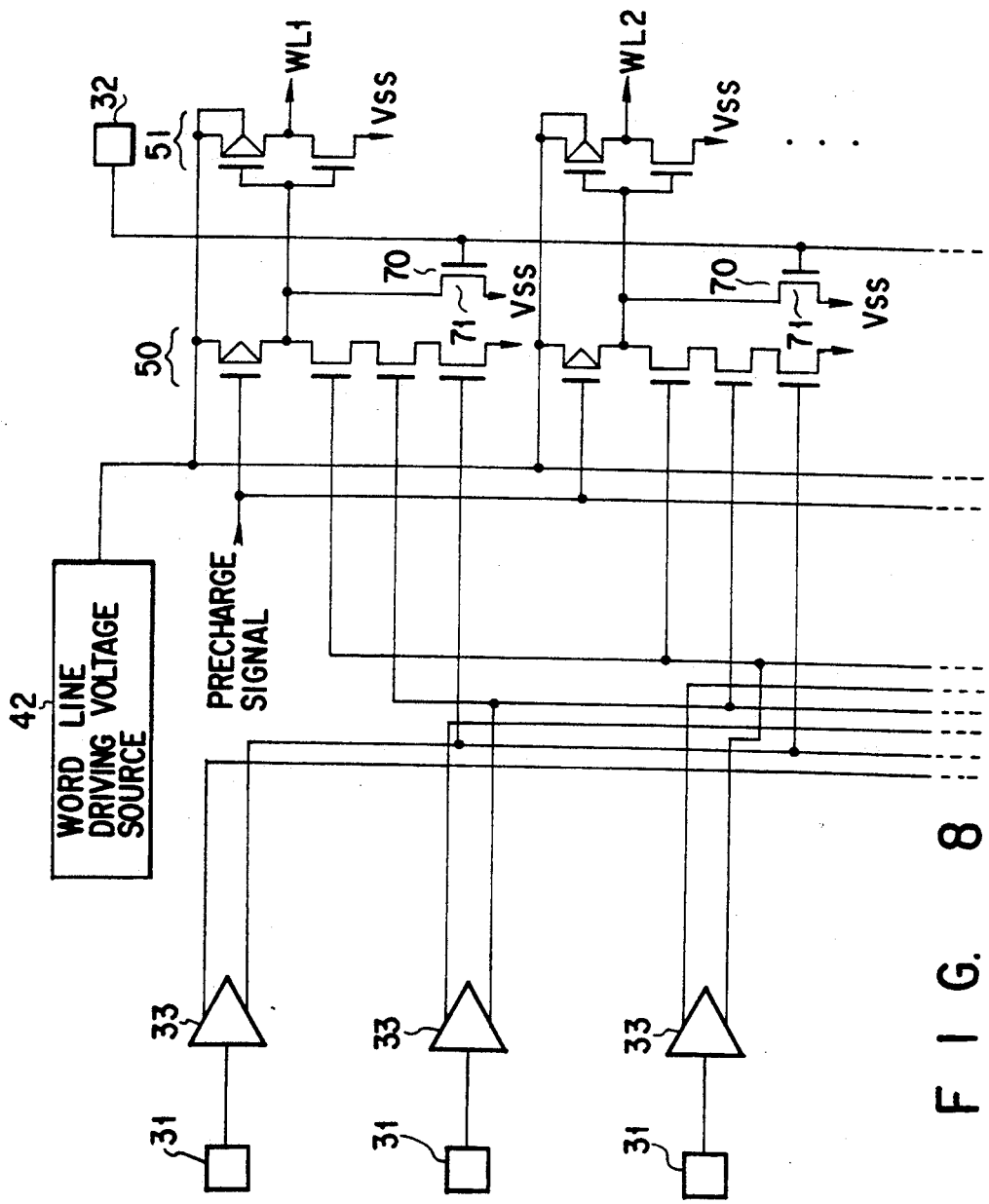
FIG. 8 is a circuit diagram showing part of a DRAM according to a fourth embodiment of the present invention.

FIG. 8 is a circuit diagram showing part of a DRAM according to a fourth embodiment of the present invention. In the DRAM of FIG. 8, control circuits 70 are arranged on the output side of the word line selecting circuit 50, in place of the control circuit 34 of FIG. 3.

The control circuits 70 each have a gate circuit connected to the output of the word line selecting circuit 50. Each of the control circuits 70 outputs a word line selecting signal from the word line selecting circuit 50 in the normal operation mode and controls the word line selecting signal in the voltage stress test so as to select rows more than those selected in response to the external address signal in the normal operation mode.

The control circuit 70 includes an NMOS transistor 71, connected to the output of the word line selecting circuit 50, for rendering the word line selecting signal in a selecting state (low level) in response to a stress test control signal of high level from the pad 32.

In the normal operation mode, the NMOS transistor 71 is turned off, and the control circuit 70 outputs the word line selecting signal. If a voltage stress test control signal of high level is input to the pad 32, the NMOS transistor 71 is turned on, and the word line selecting signal is set to "L" in level.

The DRAM of FIG. 8 is basically able to perform the same operation as that of FIG. 3, and the same advantage can be obtained from the DRAM of FIG. 3.

Figure 9:
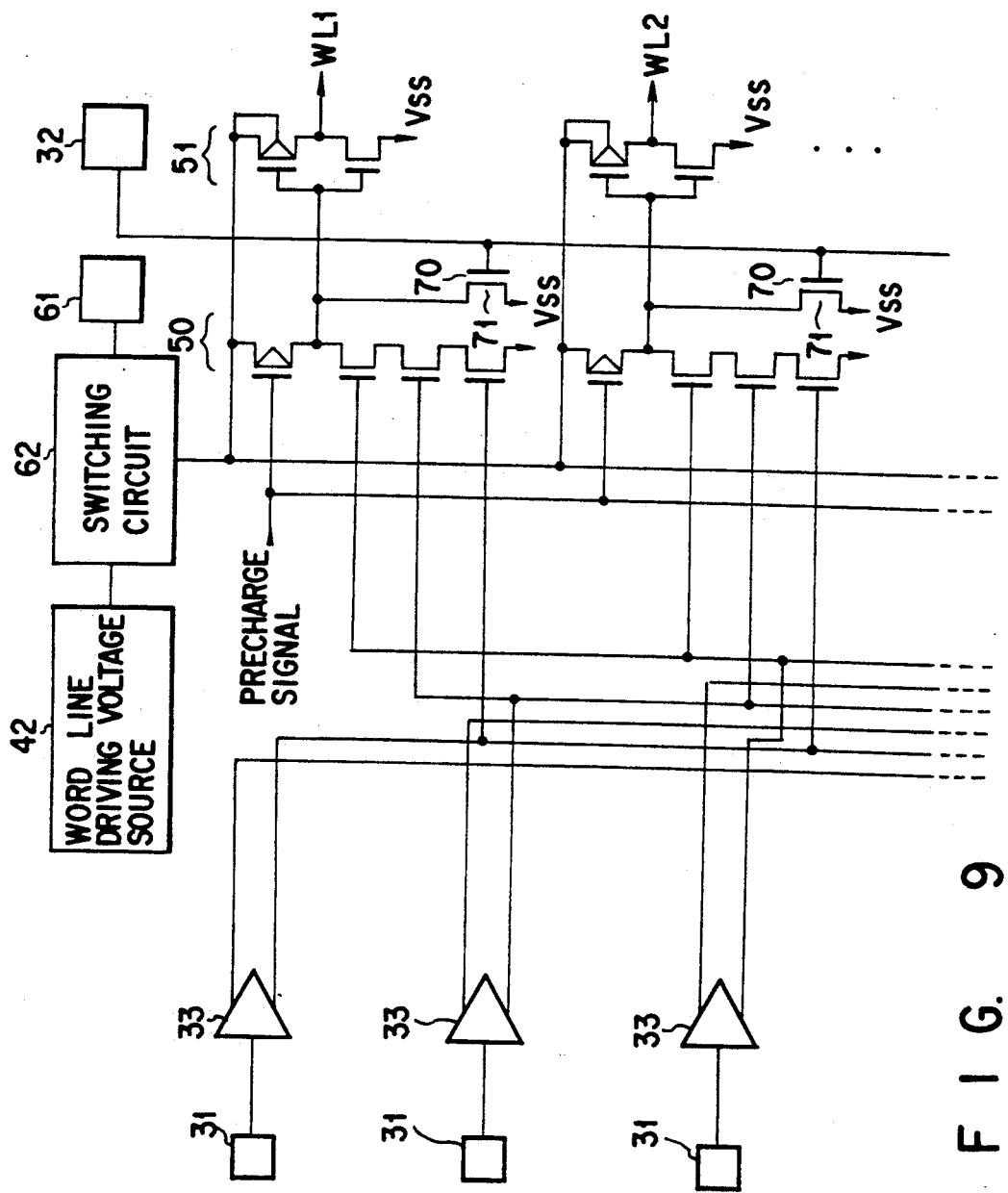
FIG. 9 is a circuit diagram showing a modification to the DRAM shown in FIG. 7.

FIG. 9 is a circuit diagram showing a modification of the DRAM shown in FIG. 7. The DRAM of FIG. 9 differs from that of FIG. 7 in that the control circuits 70 are arranged on the output side of the word line selecting circuit 50. The DRAM of FIG. 9 is basically able to perform the same operation as that of FIG. 7, and the same advantage can be obtained from the DRAM of FIG. 3.

The bit line potential control means (such as the switching NMOS transistor 47 and the bit line voltage application circuit 48) as shown in FIG. 4, can be applied to the DRAMs shown in FIGS. 3, 5, and 7-9.

In the above embodiments, the pad 32 for receiving a voltage stress test control signal and the pad 61 for applying a word line driving voltage can constitute a bonding pad. However, when a wafer is burned in, these pads can be so constructed that they are brought into contact with a probe of a probe card of a tester to apply a voltage. When a packaged chip is burned in, the pads 32 and 61 can be so constructed that they can be connected with a wiring layer outside the chip when the chip is packaged.

When the DRAMs of the above embodiments are burned in, at least one of the pads 32 and 61 is used for a plurality of chips, and a wiring layer for connecting the one pad and the chips can be formed on the wafer (e.g., on a dicing line region).

There are following five methods of supplying the voltage stress test control signal.

(a) The signal is input from outside through the pads 32 and 61 when the DRAM is in the form of wafer (b) The signal is input from outside through a dedicated terminal, which is not used in the normal operation mode, after a DRAM chip is packaged.

(c) The signal is generated on the chip, based on an input address key code, as an option of modes in which the device goes to a test mode if a write enable (WE) signal and a column address strobe (CAS) signal are activated in a WE and CAS before RAS (WCBR) mode standardized by the Joint Electron Devices Engineering Council (JEDEC), that is, when the RAS signal is activated.

(d) The signal is supplied by applying a voltage, which is not used in the normal operation mode, from outside to an arbitrary terminal (which can be used in the normal operation mode). For example, when the power supply potential Vcc is 5 V, a voltage of 7 V is applied.

(e) The signal is supplied to a plurality of terminals used in the normal operation mode in the order which is not used in the normal operation mode.

In the above embodiments, a voltage stress test for the burn-in is performed. However, the present invention is effective in performing the voltage stress test irrespective of increase in temperature.

The present invention is not limited to the above embodiments. Various changes and modifications can be made without departing from the scope and spirit of the claimed invention.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor memory device, comprising:
dynamic memory cells arranged in a row and column array, each of said dynamic memory cells comprising a transfer MOS transistor of a first conductivity type and a capacitive element coupled to said transfer MOS transistor for storing data;
word lines each connecting the dynamic memory cells in one row of said array;

bit lines each connecting the dynamic memory cells in one column of said array;

pads for receiving external address signals;

address amplifying circuits coupled to said pads and responsive to the external address signals for generating first internal address signals for selecting a first number of said word lines in a normal operation mode;

a control circuit responsive to a voltage stress test control signal for generating second internal address signals for selecting a second number of said word lines in a voltage stress test mode, the second number being greater than the first number;

word line selecting circuits responsive to the first and second internal address signals for outputting word line selecting signals to select ones of said word lines;

a word line driving voltage source for outputting a word line driving voltage; and word line driving circuits each coupled between corresponding ones of said word lines and said word line selecting circuits and responsive to said word line selecting signals for driving selected word lines, each of said word line driving circuits including:

a first transistor of the first conductivity type having a first current terminal coupled to the corresponding one of said word line selecting circuits, a second current terminal, and a control terminal coupled to a power supply potential;

a second transistor of a second conductivity type opposite the first conductivity type having a first current terminal coupled to said word line driving voltage source, a second current terminal coupled to the corresponding one of said word lines, and a control terminal coupled to said second current terminal of said first transistor;

a third transistor of the first conductivity type having a first current terminal coupled to the corresponding ones of said word lines, a second current terminal coupled to a ground potential, and a control terminal coupled to the corresponding one of said word line selecting circuits; and a fourth transistor of the second conductivity type having a first current terminal coupled to said word line driving voltage source, a second current terminal coupled to said control terminal of said second transistor, and a control terminal coupled to the corresponding one of said word lines.

2. The semiconductor memory device, according to claim 1, wherein said word line driving voltage source comprises:

a word line driving voltage source output terminal for outputting the word line driving voltage;

a clock signal generating circuit having first and second outputs;

an inverter having a first terminal coupled to said first output of said clock signal generating circuit, and a second terminal;

a first capacitor having a first terminal coupled to said second terminal of said inverter, and a second terminal;

a second capacitor having a first terminal coupled to said second output of said clock signal generating circuit, and a second terminal;

a fifth MOS transistor having a first current terminal coupled to said second terminal of said first capacitor, a second current terminal coupled to receive the power supply voltage, and a control terminal coupled to said second output of said clock signal generating circuit;

a sixth MOS transistor having a first current terminal coupled to said second terminal of said first capacitor, a second current terminal coupled to receive the power supply voltage, and a control terminal coupled to said second terminal of said inverter;

a seventh MOS transistor having a first current terminal coupled to a connection node between said second terminal of said first capacitor and said first current terminal of said fifth MOS transistor, a second current terminal coupled to said word line driving voltage source output terminal, and a control terminal coupled to said connection node between said second terminal of said first capacitor and said first current terminal of said fifth MOS transistor; and a eighth MOS transistor having a first current terminal coupled to a connection node between said second terminal of said second capacitor and said first current terminal of said sixth MOS transistor, a second current terminal coupled to said word line driving voltage source output terminal, and a control terminal coupled to said connection node between said second terminal of said first capacitor and said first current terminal of said sixth MOS transistor.

3. The semiconductor memory device according to claim 1, further comprising:

a bit line voltage application circuit, said bit line voltage application circuit including a bit line voltage application circuit output terminal, a voltage generating circuit for generating a first voltage, a terminal coupled to the ground voltage, and a switch for selectively coupling said bit line voltage application circuit output terminal to one of the first voltage and the ground voltage;

switching transistors each having a first current terminal coupled to a corresponding one of said bit lines, a second current terminal coupled to said bit line application circuit output terminal, and a control terminal coupled to receive a switching signal for selectively coupling said bit lines to said bit line voltage application circuit output terminal.

4. The semiconductor memory device according to claim 1, further comprising:

a pad for receiving an externally supplied word line driving voltage during the voltage stress test mode;

a switching circuit having a first input terminal coupled to said word line driving voltage source, a second input terminal coupled to said pad, and an output terminal coupled to said first current terminal of said second transistor, said switching circuit supplying a voltage output by said word line driving voltage source during the normal operation mode and supplying a voltage received at said pad during the voltage stress test mode.

5. A semiconductor memory device, comprising:

dynamic memory cells arranged in a row and column array, each of said dynamic memory cells comprising a transfer MOS transistor of a first conductivity type and a capacitive element coupled to said transfer MOS transistor for storing data;

word lines each connecting the dynamic memory cells in one row of said array;

bit lines each connecting the dynamic memory cells in one column of said array;

pads for receiving external address signals;

address amplifying circuits coupled to said pads and responsive to the external address signals for generating first internal address signals for selecting a first number of said word lines in a normal operation mode;

a word line driving voltage source;

word line selecting circuits responsive to the first internal address signals for outputting word line selecting signals to select ones of said word lines, said word line selecting circuits each comprising a logic gate for decoding the first internal address signals and a precharge transistor having a first current terminal coupled to said word line driving voltage source, a second current terminal coupled to an output of said logic gate, and a control terminal receiving a precharge signal for precharging said output of said logic gate;

a control circuit responsive to a voltage stress test control signal for selecting a second number of said word lines in a voltage stress test operation mode, the second number being greater than the first arbitrary number; and word line driving circuits coupled between corresponding ones of said word line selecting circuits and said word lines, and responsive to the word line selecting signals and said control circuit for driving selected word lines, said word line driving circuits comprising a CMOS inverter including a first transistor of a second conductivity type opposite the first conductivity type having a first current terminal coupled to said word line driving voltage source, a second current terminal coupled to the corresponding one of said word lines, and a control terminal connected to the corresponding one of said word line selecting circuits, and a second transistor of the first conductivity type having a first current terminal coupled to the corresponding one of said word lines, a second current terminal coupled to the ground potential, and a control terminal coupled to the corresponding one of said word line selecting circuits.

6. The semiconductor memory device according to claim 5, wherein said control circuit comprises circuitry connected between said address amplifiers and said word line selecting circuits for supplying the first internal address signals to said word line selecting circuits in the normal operation mode and for supplying second internal address signals for selecting the second number of word lines to said word line selecting circuits in the voltage stress test operation mode.

7. The semiconductor memory device according to claim 5, wherein said control circuit comprises:

MOS transistors each having a first current terminal coupled to the output of a corresponding one of said logic gates, a second current terminal coupled to the ground potential, and a control terminal receiving the voltage stress test control signal.

8. The semiconductor memory device according to claim 5, further comprising:

a pad for receiving an externally supplied word line driving voltage during the voltage stress test mode;

a switching circuit having a first input terminal coupled to said word line driving voltage source, a second input terminal coupled to said pad, and an output terminal coupled to said first current terminal of said second transistor, said switching circuit supplying a voltage output by said word line driving voltage source during the normal operation mode and supplying a voltage received at said pad during the voltage stress test mode.

* * * * *